United States Patent
Aihara et al.

(10) Patent No.: US 7,442,450 B2
(45) Date of Patent: Oct. 28, 2008

(54) YTTRIA SINTERED BODY, ELECTROSTATIC CHUCK, AND MANUFACTURING METHOD OF YTTRIA SINTERED BODY

(75) Inventors: Yasufumi Aihara, Nagoya (JP); Hiroto Matsuda, Ogaki (JP)

(73) Assignee: NGK Insulators, Ltd., Nagoya-Shi (JP)

( * ) Notice: Subject to any disclaimer, the term of this patent is extended or adjusted under 35 U.S.C. 154(b) by 144 days.

(21) Appl. No.: 11/503,715

(22) Filed: Aug. 14, 2006

(65) Prior Publication Data

US 2007/0042897 A1    Feb. 22, 2007

(30) Foreign Application Priority Data

Aug. 19, 2005    (JP)    ............................. 2005-239115

(51) Int. Cl.
- B32B 15/04    (2006.01)
- B32B 18/00    (2006.01)
- C04B 35/505   (2006.01)
- C04B 35/569   (2006.01)

(52) U.S. Cl. ...................... 428/698; 428/699; 428/701; 428/702; 501/88; 501/152; 279/128

(58) Field of Classification Search .................. 501/152, 501/88; 279/128; 428/698, 699, 701, 702; 264/618

See application file for complete search history.

(56) References Cited

U.S. PATENT DOCUMENTS

| | | | | |
|---|---|---|---|---|
| 6,139,983 A | * | 10/2000 | Ohashi et al. | 428/698 |
| 6,632,549 B1 | * | 10/2003 | Ohashi et al. | 428/698 |
| 7,220,497 B2 | * | 5/2007 | Chang | 428/701 |
| 2006/0073349 A1 | * | 4/2006 | Aihara et al. | 428/469 |
| 2006/0199722 A1 | * | 9/2006 | Aihara et al. | 501/97.2 |

FOREIGN PATENT DOCUMENTS

| | | | |
|---|---|---|---|
| JP | 110798830 | * | 3/1999 |
| JP | 2002-068838 A1 | | 3/2002 |
| JP | 2002-255647 A1 | | 9/2002 |

* cited by examiner

*Primary Examiner*—Karl E Group
(74) *Attorney, Agent, or Firm*—Burr & Brown

(57) ABSTRACT

A yttria sintered body contains an amount of silicon carbide within a range of 5 to 40% by volume, has a volume resistivity at room temperature within a range of $1 \times 10^1$ to $1 \times 10^{17}$ Ω·cm, and is adapted for application to an electrostatic chuck.

8 Claims, 5 Drawing Sheets

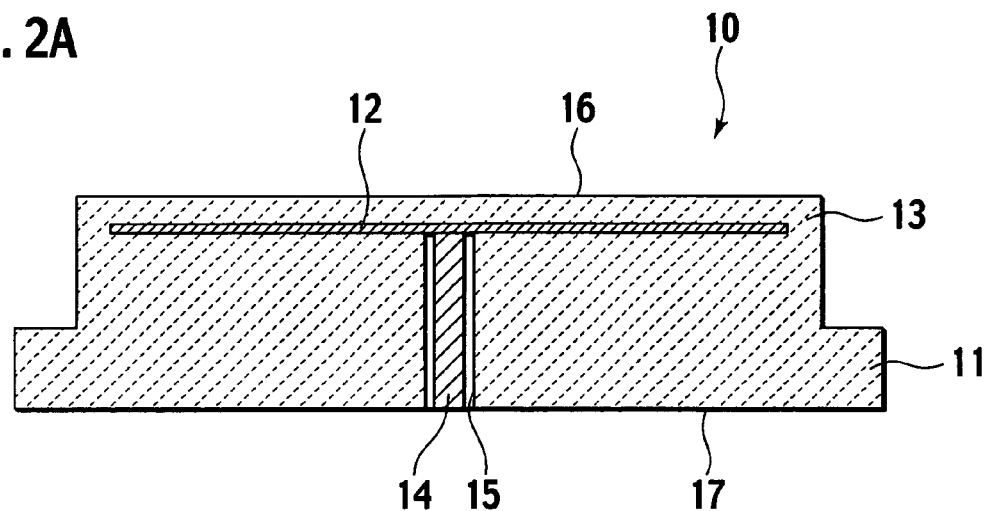
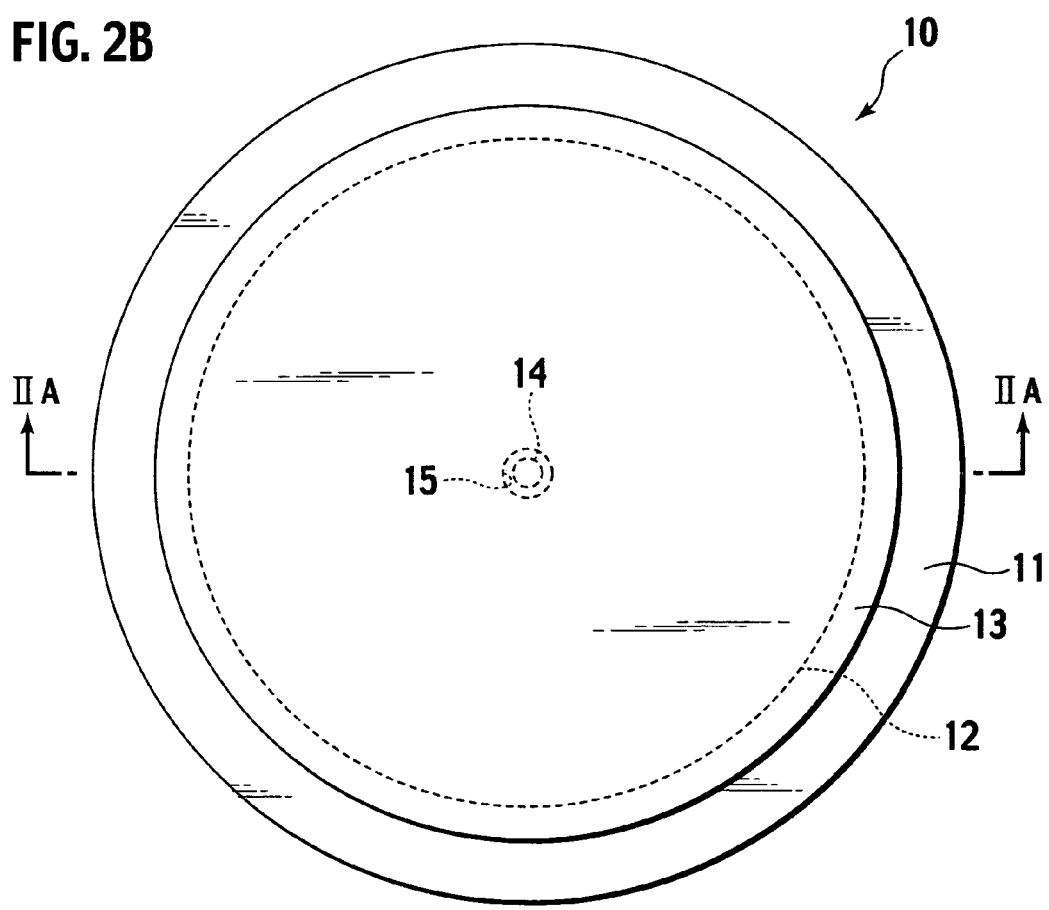

FIG. 5

| | EXAMPLE 1 | EXAMPLE 2 | EXAMPLE 3 | EXAMPLE 4 | COMPARATIVE EXAMPLE 1 | COMPARATIVE EXAMPLE 2 |
|---|---|---|---|---|---|---|
| COMPOSITION PROPORTION (VOLUME %) — YTTRIA | 90 | 70 | 65 | 65 | 100 | 50 |
| COMPOSITION PROPORTION (VOLUME %) — SILICON CARBIDE | 10 | 30 | 30 | 30 | 0 | 50 |
| COMPOSITION PROPORTION (VOLUME %) — ALUMINA | 0 | 0 | 5 | 5 | 0 | 0 |
| SINTERING TEMPERATURE (°C) | 1800 | 1800 | 1800 | 1900 | 1800 | 2000 |
| RELATIVE DENSITY (%) | >99% | >99% | >99% | >99% | >99% | >99% |
| FOUR-POINT FLEXURAL STRENGTH (MPa) | 200 | 310 | 340 | 360 | 120 | 400 |
| FRACTURE TOUGHNESS (MPa·m$^{1/2}$) | 1.5 | 2.0 | 2.3 | 2.5 | 1.1 | 2.6 |
| CORROSION LOSS (μm) | 1.0 | 1.2 | 1.3 | 1.3 | 0.6 | 6.9 |
| VOLUME RESISTIVITY (Ω·cm) — ROOM TEMPERATURE | 1×10$^{16}$ | 5×10$^{5}$ | 4×10$^{6}$ | 5×10$^{7}$ | 1×10$^{16}$ | — |
| VOLUME RESISTIVITY (Ω·cm) — 150°C | 1×10$^{14}$ | 1×10$^{4}$ | 5×10$^{5}$ | 7×10$^{6}$ | 1×10$^{15}$ | — |

YTTRIA SINTERED BODY, ELECTROSTATIC CHUCK, AND MANUFACTURING METHOD OF YTTRIA SINTERED BODY

CROSS-REFERENCE TO RELATED APPLICATION

This application is based upon and claims the benefit of priority from Patent Application No. 2005-239115 filed on Aug. 19, 2006, in the Japanese Patent Office, of which the contents are incorporated herein by reference.

BACKGROUND OF THE INVENTION

1. Field of Art

This application relates to a yttria sintered body, an electrostatic chuck using a yttria sintered body, and a manufacturing method of a yttria sintered body.

2. Description of Related Art

Conventional semiconductor manufacturing apparatus, liquid crystal manufacturing apparatus, and the like employ an electrostatic chuck for chucking a semiconductor substrate, liquid crystal substrate, and the like to be held. The electrostatic chuck is made by aluminum nitride, alumina, or the like that is excellent in heat resistance, corrosion resistance, etc.

The yttria sintered body has a very high corrosion resistance, and has applications under study, to corrosion-resistive materials to be used in a corrosive gas environment, as disclosed in Japanese Patent Application Laid-Open Publication Nos. 2002-68838 and 2002-255647.

Recent electrostatic chucks are subject to more severe criteria of corrosion resistance than ever. For example, electrostatic chucks are exposed to a plasma environment of more severe halogen corrosive gas in their etching processes to which an in-situ cleaning is introduced, so that corrosion may be unsuccessfully prevented even on electrostatic chucks made by aluminum nitride, alumina, or the like.

Then, a trial was made of application of a highly corrosion-resistant yttria sintered body to an electrostatic chuck, with an encountered new problem. The yttria sintered body is inferior in some mechanical properties, such as flexural strength and fracture toughness. As the yttria sintered body constitutes the electrostatic chuck, inferiority in some mechanical properties may cause damages in processes of the manufacturing, with a reduced yield. For example, cracks or chipping may occur when drilling a hole for insertion of a terminal to be joined to an electrode, or cracks may develop with thermal stresses when brazing a terminal to an electrode.

Besides, for an electrostatic chuck to exhibit a high chucking performance, it is essential for its dielectric layer to have an adequate volume resistivity. However, the volume resistivity of conventional yttria sintered bodies reside in an unfavorable range for the electrostatic chuck to be adapted to make use a Johnsen-Rahbek force, thus failing to provide a high chucking performance.

It therefore is an object the invention to provide a yttria sintered body having an excellent corrosion resistance and mechanical strength, and a controlled volume resistivity. It also is an object of the invention to provide an electrostatic chuck having an excellent corrosion resistance and mechanical strength, and a high chucking performance.

SUMMARY OF THE INVENTION

According to an aspect of the invention, a yttria sintered body contains an amount of silicon carbide within a range of 5 to 40% by volume, and has a volume resistivity at room temperature within a range of $1\times10^1$ to $1\times10^{17}$ Ω·cm.

According to this aspect, the yttria sintered body is allowed by inclusion of an adequate amount of silicon carbide to have, without impairing high corrosion resistance, an enhanced mechanical strength and a volume resistivity controlled within a prescribed range. This allows for provision of a yttria sintered body having an excellent corrosion resistance and mechanical strength, and a controlled volume resistivity.

The yttria sintered body may preferably have the amount of silicon carbide within a range of 10 to 30% by volume, and the volume resistivity at room temperature within a range of $1\times10^8$ to $1\times10^{13}$ Ω·cm. This allows for a more enhanced mechanical strength, having a high corrosion resistance of yttria maintained, as well as for provision of a yttria sintered body favorable in application to a dielectric layer of an electrostatic chuck to be adapted to make use of a Johnsen-Rahbek force.

The silicon carbide may preferably have an average particle size within a range of 0.1 to 10 μm. This allows for a more enhanced flexural strength of the yttria sintered body.

The yttria sintered body may preferably have a flexural strength of 250 MPa or more. The yttria sintered body may preferably have a fracture toughness of 1.5 MPa·m$^{1/2}$ or more.

The yttria sintered body may preferably have a relative density of 98% or more. This allows for a more enhanced mechanical strength and corrosion resistance.

The yttria sintered body may preferably be sintered by a hot pressing method. This allows the yttria sintered body to be more densified, allowing for an increased enhancement in the mechanical strength, as well as in the corrosion resistance.

According to an aspect of the invention, an electrostatic chuck adapted to make use of a Johnsen-Rahbek force comprises a base body, an electrode formed on the base body, and a dielectric layer formed on the electrode, and made by an yttria sintered body containing an amount of silicon carbide within a range of 10 to 30% by volume, and having a volume resistivity at room temperature within a range of $1\times10^8$ to $1\times10^{13}$ Ω·cm.

According to this aspect, the electrostatic chuck is allowed, by inclusion of an adequate amount of silicon carbide in the dielectric layer, to have an excellent mechanical strength and corrosion resistance at the dielectric layer, and to have a volume resistivity of the dielectric layer controlled within a suitable range for the electrostatic chuck to make use of the Johnsen-Rahbek force. This allows the electrostatic chuck to be excellent in mechanical strength and corrosion resistance, and adapted for a high chucking performance.

The base body may preferably be made by a sintered body containing alumina. This allows the base body and the dielectric layer to have their coefficients of thermal expansion come close to each other, and have an enhanced chemical affinity therebetween, as well. This allows for an enhanced bonding strength therebetween, as well as for an enhanced mechanical strength of an entirety of the electrostatic chuck due to the excellency in mechanical strength of the sintered body containing alumina.

The base body may preferably be made by a yttria sintered body, which contains an amount of silicon carbide within a range of 10 to 30% by volume. This allows the base body and the dielectric layer to have a diminished difference between their coefficients of thermal expansion, allowing for a improved bonding strength therebetween. In addition, by successful prevention of occurrences of a warp of the dielectric layer due to the sintering or such, the dielectric layer is allowed to have a maintained evenness in thickness, allowing for a uniform distribution of chucking forces. Further, the combination of base body and dielectric layer both made by a yttria sintered body having an excellent mechanical strength and corrosion resistance allows for provision of an electrostatic chuck with a very high mechanical strength and corrosion resistance.

The electrostatic chuck may preferably further comprise a terminal configured to connect the electrode to a power supply member; and a connecting member buried in the base body, joined to the electrode and the terminal, and configured to interconnect the electrode and the terminal. This allows that part of the base body which tends to have a reduced strength such as by provision of a hole for insertion of the terminal, to be reinforced by burial of the connecting member, allowing for an enhanced mechanical strength of the electrostatic chuck.

The connecting member may preferably have a joint face with the electrode and a joint face with the terminal at a distance of 1 mm or more from each other. This allows the electrostatic chuck to be reinforced more adequately, allowing for a yet enhanced mechanical strength thereof.

The connecting member may preferably contain at least one of platinum and niobium. This allows the base body and the connecting member to have their coefficients of thermal expansion come close to each other, allowing for successful prevention of occurrences of cracks due to burial of the connecting member in the base body.

According to an aspect of the invention, a manufacturing method of a yttria sintered body comprises preparing raw material powder containing an amount of silicon carbide within a range of 5 to 40% by volume, and yttria, forming a compact using the raw material powder, and sintering the compact in an inert gas atmosphere within a temperature range of 1500 to 2000° C. According to this aspect, the manufacturing method is allowed, by inclusion of silicon carbide within the range of 5 to 40% by volume, to provide a yttria sintered body having an excellent mechanical strength and corrosion resistance, while having a controlled volume resistivity.

The sintering may preferably comprise sintering the compact by a hot pressing method. This allows for a more densified yttria sintered body having an enhanced mechanical strength and corrosion resistance.

BRIEF DESCRIPTION OF THE DRAWINGS

The above and further objects, features and advantages of the invention will more fully appear in the detailed description of embodiments of the invention, when the same is read in conjunction with the drawings, in which:

FIG. 2A is a section along line IIA-IIA of FIG. 2B which is a plan of an electrostatic chuck according to an embodiment of the invention;

FIG. 5 is a table listing results of evaluation about the examples of yttria sintered body.

DETAILED DESCRIPTION OF EMBODIMENTS OF THE INVENTION

There will be described into details a yttria sintered body, a manufacturing method of the yttria sintered body, and a variety of electrostatic chucks using the yttria sintered body, as embodiments of the invention.

(Yttria Sintered Body)

Figure 1:
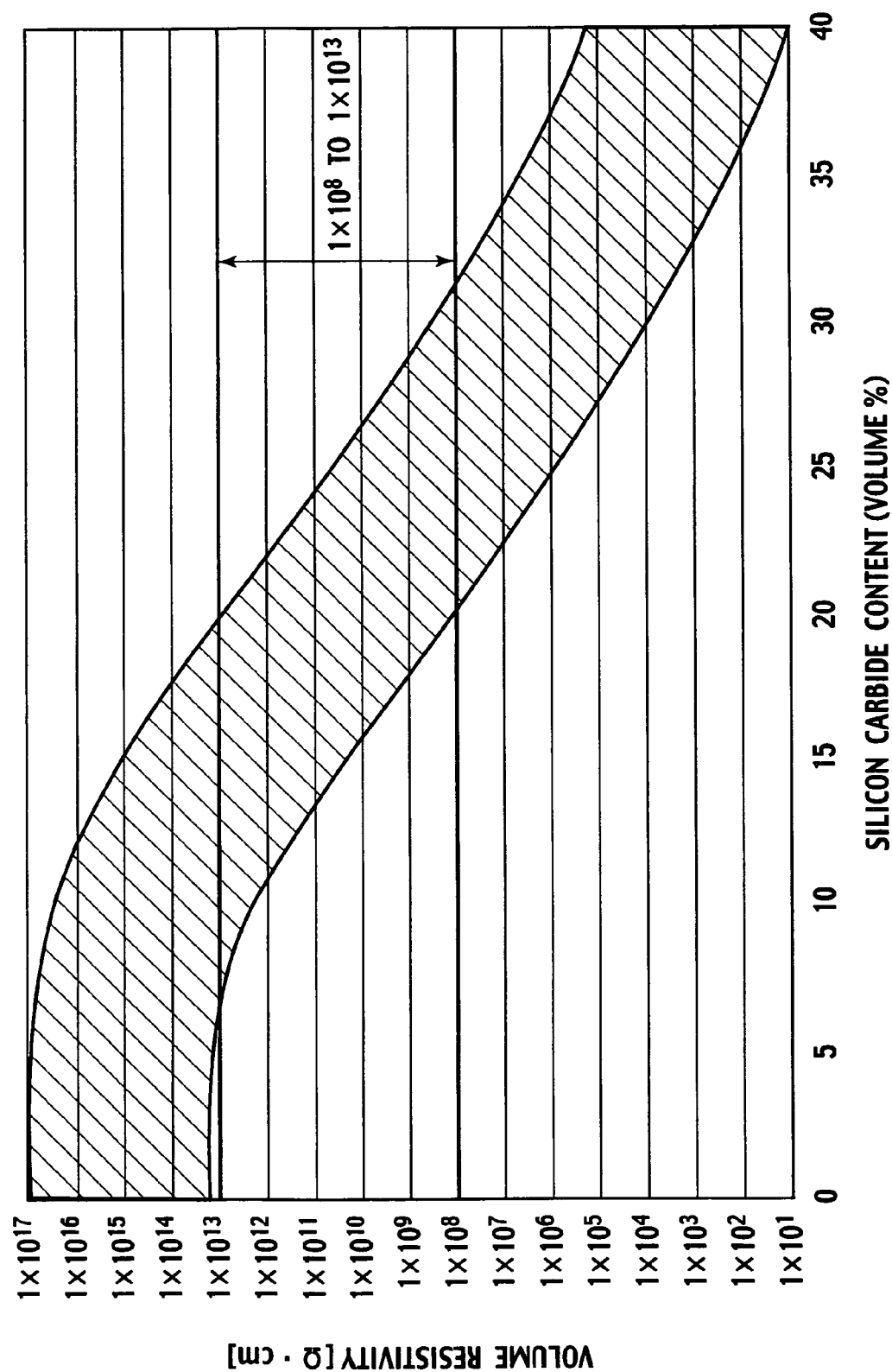
FIG. 1 is a graph showing a relationship of volume resistivity at room temperature vs. silicon carbide content of a yttria sintered body according to embodiments of the invention.

According to an embodiment of the invention, a yttria sintered body includes a major content of yttria ($Y_2O_3$) as a principal ingredient, and a content of silicon carbide (SiC) ranging 5 to 40% by volume. The yttria sintered body has: on the one hand, an enhanced mechanical strength, which cannot be achieved in a range of silicon carbide content below 5% by volume; and on the other hand, a significant corrosion resistance, which is greatly reduced in a range of silicon carbide content above 40% by volume. The yttria sintered body is adapted by the range of silicon carbide content of 5 to 40% by volume, to be prepared with a volume resistivity of yttria sintered body at room temperature (to JIS C2141) controlled within a range of $1\times10^1$ to $1\times10^{17}$ Ω·cm, as is apparent from FIG. 1 which is a graph showing a relationship of volume resistivity at room temperature vs. silicon carbide content of the yttria sintered body. In the graph of FIG. 1, the axis of ordinate represents the volume resistivity (in Ω·cm) at room temperature, and the axis of abscissa represents the silicon carbide content (in vol. %) of the yttria sintered body.

The yttria sintered body is thus enabled, by inclusion of an adequate amount of silicon carbide, more specifically, by a content of silicon carbide within the above-noted range, to have a drastically enhanced mechanical strength with a controlled volume resistivity within a prescribed range, without losing a high corrosion resistance. This allows provision of a yttria sintered body with an excellent corrosion resistance, a high mechanical strength, and a controlled volume resistivity.

The yttria sintered body may preferably include a content of silicon carbide within a range of 10 to 30% by volume. This allows for a more enhanced mechanical strength, with a maintained high corrosion resistance of yttria. Further, the volume resistivity of yttria sintered body at room temperature can be set within a range of $1\times10^8$ to $1\times10^{13}$ Ω·cm defined by thick lines in FIG. 1, thus allowing provision of a yttria sintered body to be suitable for a dielectric layer of an electrostatic chuck making use of a Johnsen-Rahbek force.

The yttria sintered body may contain alumina ($Al_2O_3$), silica ($SiO_2$), zirconia ($ZrO_2$), silicon nitride ($Si_3N_4$), and the like, as a toughening agent or a sintering additive, besides yttria and silicon carbide (SiC), while their contents excluding yttria and silicon carbide may preferably be controlled in total amount under 5% by volume.

The yttria sintered body may preferably have an average grain size within a range of 0.5 to 5.0 μm. By restriction to this range of average grain size of yttria sintered body, the yttria sintered body is allowed to have a more enhanced mechanical strength. In particular, silicon carbide contained in the yttria sintered body may preferably have an average grain size within a range of 0.1 to 10 μm. By restriction to this range of average grain size of silicon carbide, the yttria sintered body is allowed to have a more enhanced flexural strength.

The yttria sintered body may preferably have a flexural strength (in terms of a four-point flexural strength at room temperature to JIS R1601) within a range of 250 MPa or more. Further, the yttria sintered body may preferably have a fracture toughness (to JIS R1607) within a range of 1.5 MPa·m$^{1/2}$ or more. More preferably, the yttria sintered body should have a flexural strength of 300 MPa or more, and/or a fracture toughness of 2 MPa·m$^{1/2}$ or more.

The yttria sintered body may preferably have a relative density within a range of 98% or more. Further, the yttria sintered body may preferably have an open porosity within a range of 1% or less. They allow the yttria sintered body to be more improved by enhanced mechanical strength and corrosion resistance.

The yttria sintered body may preferably have a specific inductive capacity (to JIS C2141) within a range of 10 or more. More preferably, the specific inductive capacity should be 11.5 or more.

The yttria sintered body may preferably have a ratio of change of volume resistivity between room temperature and 150° C., within a range of one digit or less. More specifically, letting R1 be a volume resistivity at a room temperature, and R2 be that at 150° C., the change ratio is determined by expression (1), such that $$\text{Change ratio}=R1/R2 \qquad (1),$$

which may preferably be below 10. This allows the yttria sintered body to have a substantially constant volume resistivity over a wide range of temperatures, from room temperature up to 150° C., and to exhibit an excellent function in application to a dielectric layer of an electrostatic chuck.

The foregoing electrical and mechanical properties of the yttria sintered body can be obtained by a later-described manufacturing method.

Preferably, the manufacturing method of yttria sintered body should have a sintering process employing a hot pressing method, which makes the yttria sintered body the more dense, allowing for additional enhancement in mechanical strength, as well as in corrosion resistance.

(Manufacturing Method of Yttria Sintered Body)

According to an embodiment of the invention, such a yttria sintered body is produced by a manufacturing method that has: a process as a step of preparing raw powder including an adequate amount of yttria and 5 to 40% by volume of silicon carbide; another process as a step of forming a compact using the raw powder; and still another process as a step of sintering the compact in an inert gas atmosphere at temperatures within a range of 1,500 to 2,000° C.

For example, the raw powder may be prepared by mixing an amount of yttria powder as a principal ingredient and an amount of silicon carbide powder, as they are weighed so that the mixture includes a content of silicon carbide within the above-noted range. Preferably, the content of silicon carbide should be within a range of 10 to 30% by volume. The raw powder may have alumina, silica, zirconia, silicon nitride, etc. added thereto as a toughening agent or a sintering additive, while their contents excluding yttria and silicon carbide may preferably be controlled in total amount under 5% by volume. The silicon carbide powder may preferably have an average particle size within a range of 0.1 to 10 μm, and the yttria powder may preferably have an average particle size within a range of 0.1 to 3.0 μm.

Then, to the raw powder thus prepared, a binder, water, dispersing agent, etc. are added, and they are mixed, thereby preparing a slurry. This slurry is granulated by an atomization granulation process or the like, to prepare granulated powder. The granulated powder may be heated at 500° C. in air atmosphere to be decarburized. This granulated powder is formed into a compact, such as by a die pressing, a CIP (cold isostatic pressing), or a slip casting method.

The compact thus formed is sintered at temperatures within a range of 1500 to 2000° C. in an inert gas atmosphere. Sintering at temperatures under 1500° C. leads to an insufficient densification, causing not simply a failed enhancement of mechanical strength, but also a reduced corrosion resistance. Sintering at temperatures over 2000° C. causes a reduced mechanical strength due to grain growth. Sintering within the temperature range of 1500 to 2000° C. allows the volume resistivity at room temperature to be controlled within a range of $1\times10^1$ to $1\times10^{17}$ Ω·cm. The sintering temperature may preferably be restricted within a range of 1700 to 1900° C., to provide a yttria sintered body with the more enhanced mechanical strength.

The inert gas atmosphere may be a nitrogen gas atmosphere, argon gas atmosphere, or such. The sintering may be performed by an arbitrary suitable method, and may well employ a hot pressing method, which makes the yttria sintered body more densified, allowing for the more improved enhancement in mechanical strength, as well as in corrosion resistance.

As described, by a manufacturing method including a preparation of raw powder containing yttria as a principal ingredient and 5 to 40% by volume of silicon carbide, and a sintering within a temperature range of 1500 to 2000° C., there can be obtained a yttria sintered body containing 5 to 40% by volume of silicon carbide, and excellent in mechanical strength and corrosion resistance, while having a volume resistivity at room temperature controlled within a range of $1\times10^1$ to $1\times10^{17}$ Ω·cm.

So long as the manufacturing conditions described are met, the manufacturing method may well be modified for adjustments of the raw powder's particle size (in average) and composition, as well as conditions of the sintering, such as sintering temperature, sintering time, and sintering method, to effect adequate control of product conditions such as composition, relative density, open porosity, and average grain size of a resultant yttria sintered body to be obtained with a content of silicon carbide within a range of 5 to 40% by volume. The yttria sintered body is thus adapted to be controlled in mechanical properties such as flexural strength and fracture toughness, as well as in electrical properties such as volume resistivity and specific inductive capacity. In particular, as will be seen from FIG. 1, the content of silicon carbide in yttria sintered body can be adjusted within the range of 5 to 40% by volume, to thereby control the volume resistivity at room temperature within the range of $1\times10^1$ to $1\times10^{17}$ Ω·cm.

According to this embodiment, a resultant yttria sintered body can be applied to various ceramic members demanding both mechanical strength and corrosion resistance, and a volume resistivity at room temperature within a range of $1\times10^1$ to $1\times10^{17}$ Ω·cm. In particular, such a yttria sintered body that contains 10 to 30% by volume of silicon carbide, and that has a volume resistivity at room temperature controlled within a range of $1\times10^8$ to $1\times10^{13}$ Ω·cm, is adapted to exhibit an excellent function, or more specifically, to exhibit a high chucking force, in application to a dielectric layer of an electrostatic chuck that makes use of a Johnsen-Rahbek force, which is an electrostatic attractive force acting between a surface of the dielectric layer and a substrate put on the surface.

(Electrostatic Chucks)

Description will be made of electrostatic chucks according to embodiments of the invention, with references made to associated drawings, in which like members or elements are designated by like reference characters.

FIGS. 2A and 2B show an electrostatic chuck 10 according to an embodiment of the invention. FIG. 2B is a plan, and FIG. 2A is a section along line IIA-IIA of FIG. 2B.

The electrostatic chuck 10 is configured with: a base body 11; an electrostatic electrode 12 formed on the base body 11, for generation of electrostatic chucking forces; a dielectric layer 13 formed on the electrode 12; and a terminal 14 connected to the electrode 12. The dielectric layer 13 is bonded to the base body 11, constituting a single sintered body together, as shown in FIG. 2A. The base body 11 has a hole 15 formed therein for the terminal 14 to be inserted therethrough. This hole 15 is opened in an opposite side 17 to a substrate mounting side 16 of the single sintered body, and extends from that side 17 to the electrode 12.

The electrostatic chuck 10 is adapted to chuck (i.e. hold) a substrate (not shown), such as a semiconductor substrate or liquid crystal substrate, placed on the substrate mounting side 16, by Jonsen-Rahbek forces acting therebetween as attractive chucking forces.

In this embodiment, the dielectric layer 13 is formed by a yttria sintered body that contains 10 to 30% by volume of silicon carbide, as a preferable example, and has a volume resistivity at room temperature within a range of $1 \times 10^8$ to $1 \times 10^{13}$ Ω·cm. More preferably, the yttria sintered body forming the dielectric layer 13 should contain 15 to 25% by volume of silicon carbide. More preferably, the volume resistivity at room temperature of the dielectric layer 13 should be within a range of $1 \times 10^9$ to $1 \times 10^{11}$ Ω·cm.

The yttria sintered body forming the dielectric layer 13 may preferably have an average grain size within a range of 0.5 to 5.0 μm. In particular, silicon carbide contained in the yttria sintered body forming the dielectric layer 13 may preferably have an average grain size within a range of 0.1 to 10 um.

The dielectric layer 13 may preferably have a flexural strength (in terms of a four-point flexural strength at room temperature to JIS R1601) within a range of 250 MPa or more. Further, the dielectric layer 13 may preferably have a fracture toughness (to JIS R1607) within a range of 1.5 MPa $m^{1/2}$ or more. More preferably, the dielectric layer 13 should have a flexural strength of 300 MPa or more, and/or a fracture toughness of 2 MPa·$m^{1/2}$ or more.

The yttria sintered body forming the dielectric layer 13 may preferably have a relative density within a range of 98% or more. Further, the yttria sintered body forming the dielectric layer 13 may preferably have an open porosity within a range of 1% or less. For the yttria sintered body forming the dielectric layer 13, the sintering may preferably be performed by a hot pressing method.

The yttria sintered body forming the dielectric layer 13 may preferably have a specific inductive capacity (to JIS C2141) within a range of 10 or more. This allows for an enhanced chucking force. More preferably, the specific inductive capacity of the dielectric layer 13 should be 11.5 or more.

The dielectric layer 13 may preferably have a ratio of change of volume resistivity between room temperature and 150° C., within a range of one digit or less. More specifically, the change ratio may preferably be below 10, as it is determined by expression (1).

The dielectric layer 13 may preferably have a thickness within a range of 0.3 to 0.5 mm. This range of thickness allows for an enhanced chucking force. More preferably, the dielectric layer 13 should have a thickness within a range of 0.3 to 0.4 mm.

The substrate mounting side 16 of the dielectric layer 13 may preferably be finished by a centerline average surface roughness (Ra) (to JISB0601) of 0.6 μm or less. This allows for a sufficient chucking force, while suppressing particle generation due to friction between the substrate mounting side 16 and a substrate. More preferably, the centerline average surface roughness should be 0.4 μm or less.

The base body 11 may preferably be formed by either a sintered body containing alumina or a yttria sintered body containing 10 to 30% by volume of silicon carbide.

Formation of the base body 11 by a sintered body containing alumina allows the base body 11 to have a coefficient of thermal expansion close to that of the dielectric layer 13, allowing for a concurrent enhancement of chemical affinity between base body 11 and dielectric layer 13. Therefore, they can have an increased binding strength in between. Further, the alumina-containing sintered body, which is excellent in mechanical strength, allows the electrostatic chuck 10 to be improved in mechanical strength of its entirety. In the case of formation by an alumina-containing sintered body, the base body 11 may be formed by an alumina sintered body, a sintered body containing alumina and zirconia, a sintered body containing alumina and magnesia (MgO), a sintered body containing alumina and silica, or the like. The sintered body forming the base body 11 may preferably have a relative density within a range of 98% or more. Further, the base body 11 may preferably have a four-point flexural strength at room temperature within a range of 300 MPa or more.

Formation of the base body 11 by a yttria sintered body containing 10 to 30% by volume of silicon carbide, like the dielectric layer 13, allows the base body 11 and the dielectric layer 13 to have identical coefficients of thermal expansion with no difference, allowing for very high bonding strength in between. Moreover, possible prevention of occurrences of warp in the dielectric layer 13, such as due to sintering, allows the dielectric layer 13 to be kept uniform in thickness, allowing for a uniform distribution of chucking forces. Still more, the combination of base body 11 and dielectric layer 13 each respectively formed by a yttria sintered body, which is excellent in mechanical strength and corrosion resistance, allows for provision of electrostatic chuck 10 having very high mechanical strength and corrosion resistance.

The base body 11 may well be formed by other ceramics sintered body, metal, composite material of ceramics sintered body and metal, or the like. For a combination of base body 11 and dielectric layer 13 made of different materials, the base body 11 and the dielectric layer 13 may preferably have their coefficients of thermal expansion (CTE) set within a range of difference of $0.50 \times 10^{-6}$/K or less, which is measured within a temperature range from room temperature to 1200° C. This provides a more enhanced bonding strength between base body 11 and dielectric layer 13. The difference of CTE between base body 11 and dielectric layer 13 may preferably be limited to $0.20 \times 10^{-6}$/K or less.

In the electrostatic chuck 10, the electrostatic electrode 12 is buried in position between the base body 11 and the dielectric layer 13, for generation of Johnsen-Rahbek forces as electrostatic chucking forces with electric power supplied from an unshown power source connected to the terminal 14. This electrode 12 may preferably be made of a material that is high of m.p. (melting point), for example, a high-m.p. material having an m.p. of 1650° C. or more. Further, the electrode 12 may preferably be made of a material that has a CTE difference of $3 \times 10^{-6}$/K or less relative to the base body 11, as well as to the dielectric layer 13. This allows for an enhanced adhesion of the electrode 12 to the base body 11, as well as to the dielectric layer 13.

More specifically, the electrode 12 may well employ a high-m.p. material containing at least one of molybdenum (Mo), tungsten (W), molybdenum carbide (MoC), tungsten carbide (WC), tungsten-molybdenum alloy, hafnium (Hf), titanium (Ti), tantalum (Ta), rhodium (Rh), rhenium (Re), platinum (Pt) and niobium (Nb).

The electrode 12 may have an arbitrary configuration, e.g., such one that is a print paste containing powdery high-m.p. material, as it is printed, or such one that employs a CVD (chemical vapor deposition) or PVD (physical vapor deposition) film or a bulk of high-m.p. material. The electrode 12 may have an arbitrary form in plan, e.g., a circular form, a semicircular form, a mesh-shaped (metallic net) form, a comb-toothed form, or a porous (punched metal) form. The electrode 12 may be a mono-polar type that has a single pole, a bi-polar type that has two divided poles, or a multi-polar type that has a greater number of separate poles than two.

To the electrode 12, the terminal 14 is joined for connection to a power supply member, such as a power supply cable, employed for electric power supply to the electrode 12. The terminal 14 is inserted into the hole 15 formed in a bottom side 17 of the base body 11 (i.e. in the opposite side to the substrate mounting side 16). The hole 15 is formed from the bottom side 17 to the electrode 12, so that this electrode 12 is exposed in part at a top end or upper bottom of hole 15. The electrode 12 and the terminal 14 are joined together by, e.g., a brazing or welding.

The base body 11, electrode 12, and dielectric layer 13 may preferably be fabricated as a single sintered body, for all of them to be bonded more robust, thereby allowing the electrostatic chuck 10 to have an enhanced strength, with a resultant prevention of electrical defaults, such as an arcing. Preferably, the integral sintering should employ a hot pressing method. The electrostatic chuck 10 may preferably have a thickness (in terms of a distance between the substrate mounting side 16 and the bottom side 17) within a range of 1 to 5 mm, allowing for a reduced thermal resistance contributing to an excellent thermal characteristic of the chuck 10.

Figure 3:
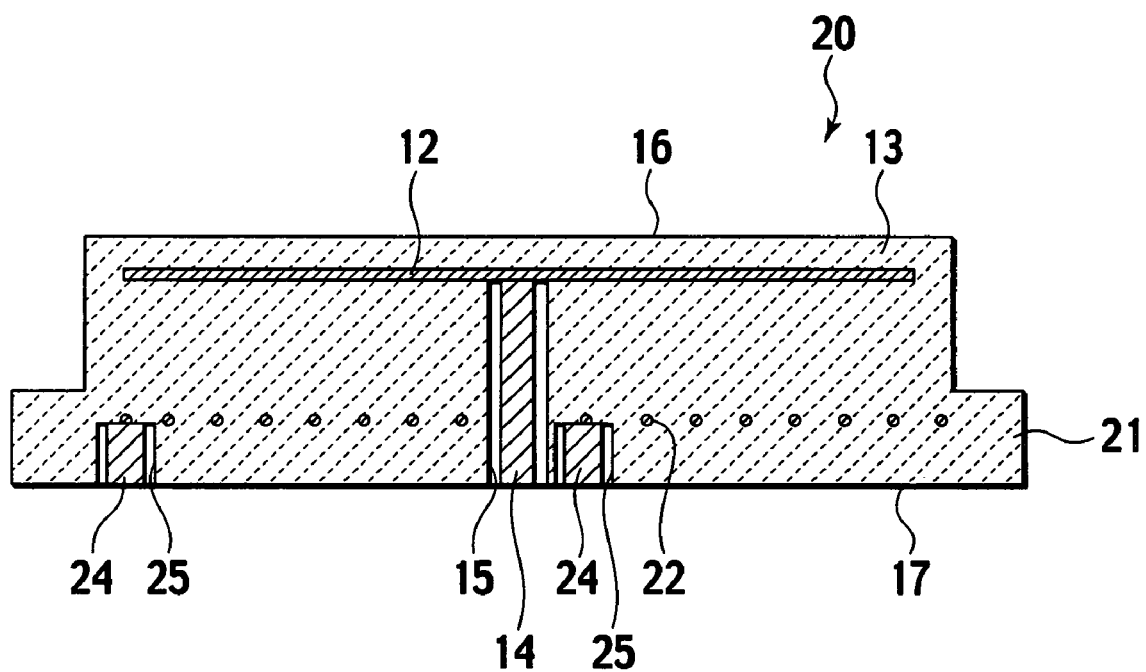
FIG. 3 is a section of an electrostatic chuck according to an embodiment of the invention.

According to an embodiment of the invention, an electrostatic chuck has a resistance heating element buried in its base body, whereby the chuck is adapted for a heating process. More specifically, as shown in FIG. 3 which is a section of such an electrostatic chuck 20, the chuck 20 is configured with a base body 21, an electrode 12, a dielectric layer 13, a terminal 14, a resistance heating element 22 buried in the base body 21, and terminals 24 for connection to the resistance heating element 22. In FIG. 3, the base body 21 and the dielectric layer 13 are bonded together as a single sintered body. It is noted that substantially identical parts to the electrostatic chuck 10 shown in FIGS. 2A and 2B are designated by identical reference characters, to eliminate redundancy. In particular, the base body 21 of chuck 20 can be formed like the base body 11 of chuck 10 shown in FIGS. 2A and 2B, and redundant description of the base body 21 is omitted.

The resistance heating element 22 is adapted, with electric power supplied from an unshown power source, for heating a substrate on a substrate mounting side 16. The resistance heating element 22 may well be made of a high-m.p. (melting point) material like the electrostatic electrode 12. The resistance heating element 22 may preferably be made of a material that has a CTE difference of $3\times10^{-6}$/K or less to the base body 21, allowing for an enhanced adhesion between base body 21 and heating element 22.

The resistance heating element 22 may have an arbitrary configuration, e.g., such one that is a print paste containing powdery high-m.p. material, as it is printed, or such one that employs a CVD or PVD film, or a linear, coiled, or band-like bulk of high-m.p. material. The resistance heating element 22 may have an arbitrary form in plan, e.g., a spiral form, a mesh-shaped form, a perforated form, or such a form that has folded parts. The resistance heating element 22 may be composed of a single pattern, or a combination of a plurality of separate patterns, e.g., a pair of patterns located in two separate regions, being a central region and a peripheral region of the substrate heating side 16.

To the resistance heating element 22, the terminals 24 are joined for connections to a power supply member connected to a power supply. The terminals 24 are inserted into holes 25 formed in a bottom side 17 of the base body 11. The holes 25 are formed from the bottom side 17 to the resistance heating element 22, so that this element 22 is exposed in part at top ends of holes 25. The resistance heating element 22 and the terminals 24 are joined together by, e.g., a brazing or welding.

The base body 21, resistance heating element 22, electrode 12, and dielectric layer 13 may preferably be fabricated as a single sintered body. Preferably, the integral sintering should employ a hot pressing method.

Figure 4A:
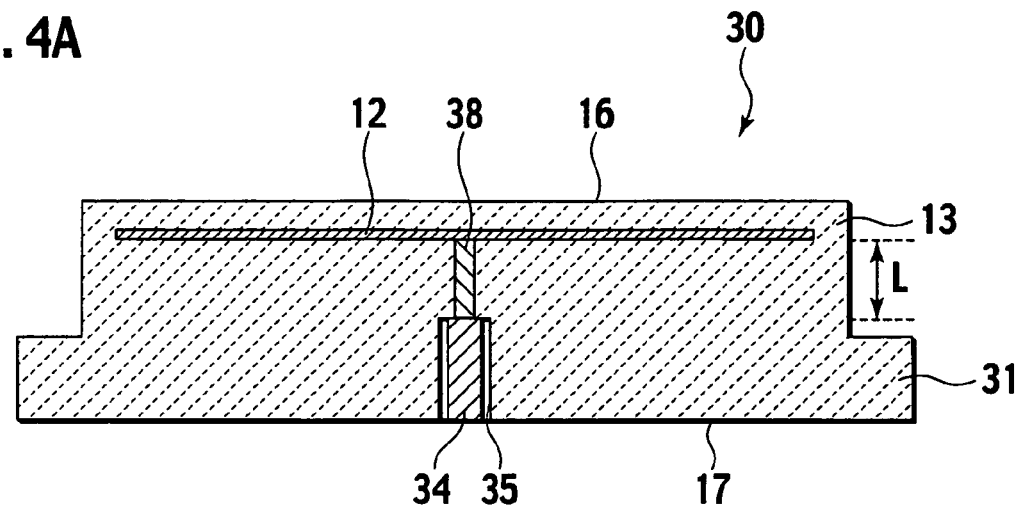
FIG. 4A is a section along line IVA-IVA of FIG. 4B which is a plan of an electrostatic chuck according to an embodiment of the invention.
Figure 4B:
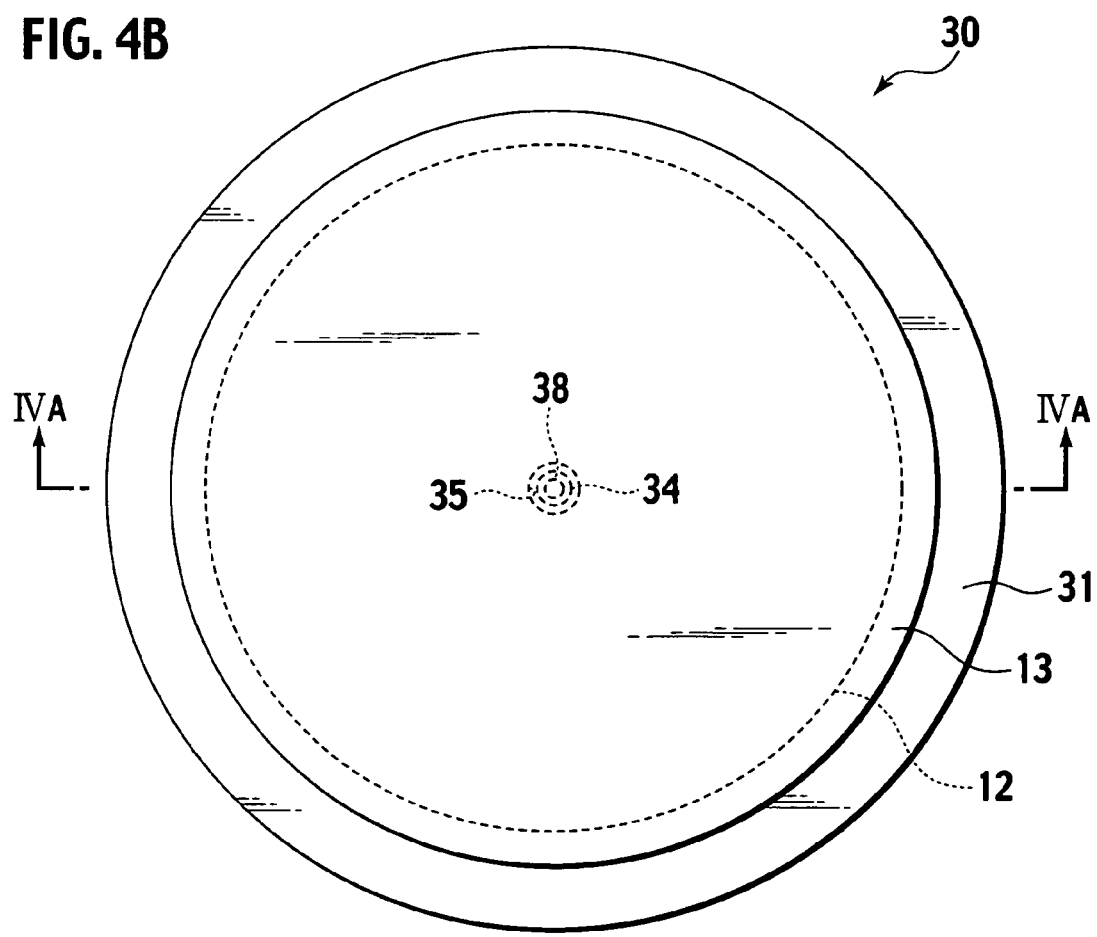

According to an embodiment of the invention, an electrostatic chuck has a connecting member as an interconnect for connection between an electrode and a terminal to be joined both thereto. FIGS. 4A and 4B show such an electrostatic chuck 30. FIG. 4B is a plan of the electrostatic chuck 30, and FIG. 4A is a section along line IVA-IVA of FIG. 2B. The chuck 30 is configured with a base body 31, an electrode 12, a dielectric layer 13, a terminal 34 for connection to a power supply member (not shown) to be connected to a power supply, a hole 35 for the terminal 34 to be inserted thereto, and a connecting member 38 buried between a top end or upper bottom of the hole 35 and the electrode 12. In FIG. 4A, the base body 31 and the dielectric layer 13 are bonded together as a single sintered body. It is noted that substantially identical parts to the electrostatic chuck 10 shown in FIGS. 2A and 2B are designated by identical reference characters, to eliminate redundancy. In particular, the base body 31 of chuck 30 can be formed like the base body 11 of chuck 10 shown in FIGS. 2A and 2B, and redundant description of the base body 31 is omitted.

The connecting member 38 is buried in the base body 31. More specifically, the connecting member 38 is buried in a layer lower than the electrode 12, and connected to the electrode 12. The connecting member 38 thus joined to the electrode 12 is joined to the terminal 34, for interconnection between the electrode 12 and the terminal 34.

The connecting member 38 may be made of a high-m.p. material like the electrode 12. In particular, for the base body 31 to be made of a yttria sintered body containing silicon carbide or a yttria sintered body containing alumina, the connecting member 38 may preferably be made of a material containing platinum or niobium (among high-m.p. materials). More specifically, the connecting member 38 may preferably be made of platinum or niobium, an alloy of platinum or niobium and a variety of metal, or the like. This allows CTE of connecting member 38 to come close to that of base body 31, to prevent occurrences of cracks due to burial of connecting member 38 in base body 31.

Preferably, the CTE difference between connecting member 38 and base body 31 should be $3\times10^{-6}$/K or less, allowing for the more enhanced prevention of occurrences of cracks therebetween.

The connecting member 38 may have an arbitrary three-dimensional form, e.g., a prismatic form, a tubular form, a disc-like form, or a spherical form, besides a cylindrical form shown in FIGS. 4A and 4B. The connecting member 38 may well have a length L of 1 mm or more in terms of a distance between a bonded face with the electrode 12 and a bonded face with the terminal 34, for adequate reinforcement of the electrostatic chuck 30 to the more enhance the mechanical strength. Preferably, the length L should be within a range of 1 to 3 mm. The connecting member 38 may well have a diameter within a range of 1 to 5 mm, when formed cylindrical, tubular, disc-like, or spherical, or a width within a range of 1 to 4 mm, when formed prismatic or such.

The base body 31 has, in a bottom side 17 thereof, the hole 35 formed for insertion of the terminal 34. The hole 35 extends from the bottom side 17 to the connecting member 38, so that this member 38 is exposed in part. The terminal 34 is inserted into the hole 35, and joined to an exposed part of the connecting member 38 by, e.g., a brazing or welding.

The brazing material may be a brazing metal, a brazing composite material as a composite of metal and ceramics, or such. For example, the brazing filler to be employed may be indium (In), gold (Au), silver (Ag), aluminum (Al), nickel (Ni), or aluminum-alumina composite, or an alloy containing two or more metals selected from among indium, gold, silver, aluminum, nickel, and titanium, e.g. a gold-nickel alloy, or the like. For the brazing, an adequate material may be filled between a terminal 34 and the connecting member 38, and heated within a temperature range of 130 to 1100° C.

The connecting member 38 may have a recess allowing an insertion of terminal 34. For this, an end part of terminal 14 may be inserted into the recess of connecting member 38, to be fit therein, to be joined.

Using such connecting member 38 allows that portion of the base body 31 of electrostatic chuck 30 which might have suffered from reduction of strength due to the provision of hole 35 for insertion of terminal 34 for example, to be reinforced by the connecting member 38 buried therein, with a resultant enhancement of mechanical strength of the electrostatic chuck 30. Further, in this chuck 30, the distance the substrate mounting side 16 has to the top end of the hole 35 formed in the base body 31 can be increased commensurately with length of the connecting member 38. Therefore, even if the dielectric layer 13 is thin in thickness, the chuck 30 can do without suffering from reduction of strength due to the formation of hole 35.

Such connecting member 38 is applicable also to the electrostatic chuck 20 of FIG. 3 which is adapted for a heating process. More specifically, the base body 21 may have buried therein a connecting member joined to both resistance heating element 22 and terminal 24, for interconnection therebetween.

In the electrostatic chuck 30 shown in FIGS. 4A and 4B, the base body 31, electrode 12, dielectric layer 13, and connecting member 38 may preferably be formed as a single sintered body, to be bonded with the more strength. In application of a connecting member to the electrostatic chuck 20 of FIG. 3, as well, the base body 21, electrode 12, dielectric layer 13, resistance heating element 22, and the connecting member may preferably be formed as a single sintered body. Preferably, a hot pressing method should be employed for formation of such a single sintered body.

Description is now made of a manufacturing method of electrostatic chuck according to an embodiment of the invention, taking the electrostatic chuck 10 as an example, in which both base body 11 and dielectric layer 13 are made of a yttria sintered body containing silicon carbide.

First, by the manufacturing method of yttria sintered body containing silicon carbide, a yttria sintered body is formed as the base body 11. Then, on this base body 11, an electrode 12 is formed. For example, the electrode 12 may be formed by printing a print paste on a surface of the base body 11, by a screen printing method or the like. Preferably, the print paste to be employed should be a mixture between powders of a high-m.p. material and powder of an identical ceramics to a ceramics to be contained in the base body 11 or dielectric layer 13 or a similar ceramics that has a CTE close to CTE of the identical ceramics. Using a print paste in which powder of a high-m.p. material and powder of such a ceramics are mixed enables CTE of electrode 12 to close to that of base body 11 or dielectric layer 13, allowing for an enhanced bonding strength in between. The print paste may preferably contain ceramics powder within a range of 5 to 30% by weight. For formation of electrode 12, the method to be employed is not limited to the above-noted printing. For example, the base body 11 may have a bulk of high-m.p. material placed on the surface, or a thin film of high-m.p. material formed on the surface by CVD or PVD, to thereby form electrode 12.

Next, on the base body 11 and electrode 12, there is formed a compact that will constitute a dielectric layer 13. For example, in a molding die or the like, where the base body 11 formed with electrode 12 is set, an amount of granulated granules prepared in a similar manner to the base body 11 may be filled over the base body 11 and electrode 12 to thereby form a compact that is to constitute a dielectric layer 13. Or, by use of granulated granules, a compact may be formed, such as by a die pressing, CIP, or slipping cast method, and may be placed on the base body 11, to be pressed to thereby form a compact that is to constitute a dielectric layer 13.

Then, the combination of base body 11, electrode 12, and compact is integrally sintered for formation of a single sintered body, such as by a hot pressing method, thereby forming a dielectric layer 13 of yttria sintered body containing silicon carbide. More specifically, exerting a pressure in a single-axial direction, a sintering is performed under required conditions (sintering atmosphere, and sintering temperature) to obtain a yttria sintered body containing silicon carbide. Preferably, the pressure to be exerted should be within a range of 50 to 300 kgf/cm$^2$, to obtain a dense yttria sintered body. More preferably, it should be within a range of 100 to 200 kgf/cm$^2$.

The base body 11, electrode 12, and dielectric layer 13 can be formed in an arbitrary order. For example, a dielectric layer 13 of yttria sintered body containing silicon carbide may be formed in advance, and an electrode 12 may be formed on the dielectric layer 13. Then, a compact that is to constitute a base body 11 may be formed on the dielectric layer 13 and electrode 12, before a single sintering of the entirety to form the base body 11 of yttria sintered body containing silicon carbide.

Like this, after formation of a base body 11 of yttria sintered body containing silicon carbide or a dielectric layer 13 of yttria sintered body containing silicon carbide, there is formed on the sintered body an electrode 12 of yttria sintered body containing silicon carbide, whereby deformation or positional deviation of the electrode 12 due to sintering shrinkage can be suppressed, allowing for an enhanced flatness of electrode 12. A resultant electrostatic chuck 10 is thereby allowed to have an improved uniformity in distribution of heat or chucking force, as an advantage. It is noted that after formation of a base body 11 or dielectric layer 13 of yttria calcined body containing silicon carbide, an electrode 12 may be formed on the calcined body, whereby also a similar effect can be achieved. The yttria calcined body containing silicon carbide may be formed by setting the calcining temperature to be lower than a sintering temperature for formation of a corresponding yttria sintered body, as well as by setting the calcining time to be shorter than a sintering time for formation of a corresponding yttria sintered body. For example, the calcining temperature may well be within a range of 1300 to 1600° C. A lamination may be formed by a compact that will constitute a base body 11, an electrode 12, and a compact that will constitute a dielectric layer 13, before a integral sintering of the lamination, such as by a hot pressing method.

Then, a single sintered body thus obtained is mechanical processed. More specifically, a grinding or polishing process is performed to establish a thickness of dielectric layer 13, a centerline average surface roughness (Ra) of substrate mounting side 16, and a total thickness of electrostatic chuck 10, as specified. The base body 11 is drilled to form a hole 15 therein for insertion of terminal. Then, a terminal 14 is inserted into the hole 15, and joined to the electrode 12 by brazing or welding.

For an electrostatic chuck 10 in which the base body 11 is made of an alumina-containing sintered body, the manufacturing method may follow the method employed in the case in which the base body 11 is a yttria sintered body containing silicon carbide, except for the following points. One point is that, for preparation of a slurry, the raw material powder to be prepared from simple alumina powder, a mixture of alumina powder and zirconia powder, a mixture of alumina powder and magnesia powder, a mixture of alumina powder and silica powder, etc. As another point, the compact is to be sintered by a hot pressing method or normal-pressure sintering method, in an inert gas atmosphere, such as nitrogen gas or argon gas, or oxidizing atmosphere, within a temperature range of 1,500 to 1,700° C.

For manufacturing method of an electrostatic chuck 20 provided with a resistance heating element 22 shown in FIG. 3, the base 21 may be formed like base 11, except for e.g. the compact to be formed with the resistance heating element 22 included.

For manufacture of an electrostatic chuck 30 provided with a connecting member 38 shown in FIGS. 4A and 4B, the connecting member 38 may be disposed in contact with the electrode 12, as this is formed on a sintered body or calcined body that will constitute a dielectric layer 13. Then, a compact that will constitute a base body 31 may be formed on the sintered body or calcined body, electrode 12, and connecting member 38, to be integrally sintered by a hot pressing method or the like, thereby joining the connecting member 38 to the electrode 12, obtaining the base body 31 with the connecting member 38 buried therein.

In this manufacturing method, an adhesive may be applied between the connecting member 38 and the electrode 12. For example, after formation of the electrode 12 on the dielectric layer 13 by a screen printing method or the like, a perforated positioning jig or such may be used to determine on the electrode 12 a location for formation of connecting member 38. Then, to the location for formation thus determined on the electrode 12, the connecting member 18 may be adhered, with a print paste applied as the adhesive therebetween. Next, the dielectric layer 13 formed with electrode 12 and connecting member 38 may be set in a molding die or the like, where an amount of granulated granules for base 31 may be filled, and pressed together to form a compact, which may be integrally sintered by a hot pressing method or the like to thereby form an electrostatic chuck 30.

Or alternatively, there may be formed a lamination of a compact that will constitute a dielectric layer 13, an electrode 12, a connecting member 38 disposed in contact with the electrode 12, and a compact that will constitute a base body 31, which may be integrally sintered by a hot pressing method or the like, whereby also the connecting member 38 can be joined to the electrode 12, allowing the base body 31 to be obtained together with the connecting member 38 buried therein.

Then, a hole 35 may be formed for insertion of a terminal 34 from a bottom side 17 of the base body 31 into a required depth for exposure of the connecting member 38, and the terminal 34 may be joined to the connecting member 38, such as a brazing or welding. Excepting such points, the manufacturing method can be done in like manner to the electrostatic chuck 10 that has no connecting members.

Each base body 11, 21, or 31 may be made of a suitable material other than ceramics, for example, a metal, or a composite material of metal and ceramics. In this case, the base body 11, 21, or 31 made of such a metal or a composite material of metal and ceramics, an electrode 12, and a dielectric layer 13 may be bonded together by an adhesive or the like.

The electrostatic chucks 10, 20, and 30 are each allowed by using a yttria sintered body containing 10 to 30% by volume of silicon carbide, to be excellent in corrosion resistance and mechanical strength, while having a dielectric layer 13 formed with a controlled volume resistivity within a suitable range for the electrostatic chuck to make use of Johnsen-Rahbek force, as described. Each electrostatic chuck 10, 20, or 30 is thus allowed for realization of high chucking force, as well as for excellency in corrosion resistance and mechanical strength.

More specifically, the electrostatic chuck 10, 20, or 30 is allowed, as it is formed by a yttria sintered body containing a prescribed amount of silicon carbide, to be excellent in corrosion resistance not simply to corrosive halogen gases such as nitrogen fluoride (NF3), but also in corrosion resistance to plasma corrosive gases. Moreover, the electrostatic chuck 10, 20, or 30 is allowed to have a sufficient corrosion resistance even to an in-situ cleaning in an etching process. The electrostatic chucks 10, 20, and 30 thus have favorable applications to the manufacture of semiconductor devices, as well as of liquid crystal devices.

Still more, their dielectric layers 13 to be exposed to corrosive environments are each allowed for an enhanced corrosion resistance suppressing the surface corrosion. Therefore, each electrostatic chuck 10, 20, or 30 is allowed for successful prevention of deteriorations such as in uniformity of thermal distribution or chucking force due to changes in condition of substrate mounting side 16 accompanied by surface corrosion.

Yet more, for the electrostatic chuck 10, 20, or 30, the dielectric layer 13 to be excellent in mechanical strength, as well, is allowed for successful prevention of occurrences of chipping, cracks, etc., when it is processed. Further, when joining the terminal 14 to the electrode 12 by a brazing, welding, or such, it also is successfully allowed to prevent the dielectric layer 13 from being damaged by thermal stresses.

This invention is not limited to the foregoing embodiments, thus allowing for a variety of modifications.

EXAMPLES

There will be detailed examples of the embodiments, while the invention is not limited thereto.

Examples of Yttria Sintered Body

Embodiment Examples 1 to 4 and Comparative Examples 1 and 2

Description is now collectively made of embodiment examples 1 to 4 and comparative examples 1 and 2.

Embodiment examples 1 and 2, as well as comparative example 2, are examples of a yttria sintered body composed of yttria and silicon carbide, where powder of yttria and powder of silicon carbide were weighed and mixed for preparation of raw material powder, so that yttria and silicon carbide had their composition ratios shown in Table 1.

Embodiment examples 3 and 4 are examples of a yttria sintered body containing alumina, besides yttria and silicon carbide, where powder of yttria, powder of silicon carbide, and powder of alumina were weighed and mixed for preparation of raw material powder, so that yttria, silicon carbide, and alumina had their composition ratios shown in Table 1.

Comparative example 1 is an example of a yttria sintered body not containing silicon carbide, where simply powder of yttria was weighed for preparation of raw material powder.

Particle size of yttria powder was 11m in average, that of silicon carbide powder, 0.5 μm in average, and that of alumina, 0.4 μm in average.

In each example, water, a dispersing agent, and polyvinyl alcohol (PVA) as a binder were added to the raw material powder, and mixed therewith by a trommel for preparation of a slurry. This slurry was atomized and dried by a spray dryer, to prepare granulated granules, which were decarburized by heating at 500° C. in atmospheric air. Decarburized granulated granules were filled in a molding die, where they were pressed in the direction of a single axis to form a compact. The compact was packed in a carbon sheath, and sintered by a hot pressing method in a nitrogen atmosphere at sintering temperatures shown in Table 1, to form a yttria sintered body of a size of 350 mm diameter by 6 mm thickness.

Of this yttria sintered body, the following five evaluations (1) to (5) were made.

Evaluation (1): a relative density was measured by an Archimedes method using pure water as a medium.

Evaluation (2): a four-point flexural strength at room temperature was measured (to JIS R1601).

Evaluation (3): a fracture toughness was measured (to JIS R1607).

Evaluation (4): the yttria sintered body was masked in part, and subjected to a corrosion resistance test for five hours in a gaseous mixture of $NF_3$ and oxygen, under a pressure of 0.1 Torr, with a plasma source power of 800 W and a bias power of 300 W. Of the yttria sintered body after the corrosion resistance test, a difference of step between the masked part and a non-masked part was measured, which was assumed to be an amount of loss due to corrosion (hereafter called "corrosion loss") for evaluation of corrosion resistance.

Evaluation (5): a volume resistivity was measured at room temperature and 150° C. (to JIS C2141). Applied voltage was 2000V/mm.

Respective results are listed in a table as shown in FIG. 5.

In the embodiment examples 1 to 4, their yttria sintered bodies containing silicon carbide within a range of 5 to 40% by volume each had a very high relative density of 98% or more, to be a very dense yttria sintered body.

The yttria sintered bodies of embodiment examples 1 to 4 each had a four-point flexural strength of 200 MPa or more, and a fracture toughness of 1.5 MPa m$^{1/2}$ or more. In the comparative example 1, its yttria sintered body had a four-point flexural strength about 120 MPa, and a fracture toughness about 1 MPa m$^{1/2}$. In comparison with the yttria sintered body of comparative example 1, the yttria sintered bodies of embodiment examples 1 to 4 had enhanced mechanical strengths. In particular, in embodiment examples 2 to 4 in which the sintering temperature was within a range of 1,700 to 1,900° C., their yttria sintered bodies containing 30% by volume of silicon carbide each had a four-point flexural strength of 300 MPa or more and a fracture toughness of approximately 2 MPa·m$^{1/2}$ or more, thus having remarkably enhanced mechanical strengths. In the embodiment examples 3 and 4, their yttria sintered bodies containing alumina in addition to silicon carbide had very high four-point flexural strengths and fracture toughnesses.

In addition, yttria sintered bodies of embodiment examples 1 to 4 each had, after the corrosion resistance test, a small corrosion loss and minor surface corrosion, successfully keeping a high corrosion resistance. Moreover, yttria sintered bodies of embodiment examples 1 to 4 had their volume resistivities at room temperature controlled within a range of $1 \times 10^1$ to $1 \times 10^{17}$ Ω·cm. Further, yttria sintered bodies of embodiment examples 3 and 4 showed values of 10 or less as their change ratios between volume resistivity at room temperature and volume resistivity at 150° C., thus successfully keeping substantially constant volume resistivities over a wide temperature range.

To the contrary, in the comparative example 1, its yttria sintered body containing no silicon carbide was very inferior in mechanical strength. In the comparative example 2, its yttria sintered body containing 50% by volume of silicon carbide had a very great corrosion loss, thus showing a wide reduction of corrosion resistance, relative to yttria sintered bodies of embodiment examples 1 to 4 each including a content of silicon carbide within a range of 40% or less by volume.

Examples of Electrostatic Chuck

Embodiment Example 5

There was manufactured an electrostatic chuck 10 of FIGS. 2A and 2B having a base body 11 made by a yttria sintered body.

First, yttria powder of an average particle size of 11m and silicon carbide powder of an average particle size of 0.5 μm were mixed, by composition ratios of 70% by volume of yttria and 30% by volume of silicon carbide, to prepare raw material powder. To the raw material powder, water, a dispersing agent, and polyvinyl alcohol (PVA) as a binder were added, and mixed together by a trommel to prepare a slurry. This slurry was atomized and dried by a spray dryer for preparation of granulated granules.

Granulated granules were filled in a molding die, where they were pressed in the direction of a single axis to form a compact. The compact was packed in a carbon sheath, and sintered by a hot pressing method in a nitrogen atmosphere at a sintering temperature of 1,900° C., to form a base body 11 of yttria sintered body.

Next, a print paste was prepared by admixing ethyl cellulose as a binder to a powder mixture of 80% by weight of tungsten carbide and 20% by weight of alumina powder. Using this paste, an electrode 12 of a size of 290 mm diameter by 20 μm thickness was formed on the base body 11 of yttria sintered body by a hot pressing method, which was dried.

Next, in a molding die, there was set the base body 11 of yttria sintered body, as it had the electrode 12 formed thereon. Over the base body 11 of yttria sintered body and the electrode 12, granules granulated similar to those in fabrication of the base body were filled, and pressed under a pressure of 200 kgf/cm$^2$, to form a compact that constitutes a dielectric layer 13.

Then, the base body 11 of yttria sintered body formed with the electrode 12 and the compact was set in a carbon sheath, and sintered by a hot pressing method in a nitrogen atmosphere at a sintering temperature of 1,900° C., to make the dielectric layer 13 of yttria sintered body.

A single sintered body thus obtained was processed for establishment of a centerline average surface roughness (Ra) of a substrate mounting side 16 to be 0.2 μm, a thickness of the dielectric layer 13 (i.e. the distance between the electrode 12 and the substrate mounting side 16) to be 0.3 min, and a thickness of the electrostatic chuck 10 (i.e. the distance between the substrate mounting side 16 and a bottom side 17) to be 3 mm. Then, the base body 11 was drilled to form a hole 15 for application of a terminal 14, and the terminal 14 was brazed to the electrode 12. By doing as described, there was obtained the electrostatic chuck 10 adapted to make use of Johnsen-Rahbek force.

The base body 11 of yttria sintered body was kept free from occurrences of cracks or chipping due to the drilling. Also the brazing between the electrode 12 and the terminal 14 could be done without damages to the base body 11 due to thermal stresses.

Embodiment Example 6

There was manufactured an electrostatic chuck 30 of FIGS. 4A and 4B having a base body 31 made by an alumina sintered body.

Granulated granules prepared like the embodiment example 5 were filled in a molding die, where they were pressed in the direction of a single axis to form a compact. This compact was packed in a carbon sheath, and sintered by a hot pressing method in a nitrogen atmosphere at a sintering temperature of 1,600° C., to form a dielectric layer 13 of yttria sintered body containing silicon carbide.

Next, a print paste was prepared like the embodiment example 5, and an electrode 12 of a size of 290 mm diameter by 20 μm thickness was formed on the dielectric layer 13 of yttria sintered body by a screen printing method, and dried. Then, a perforated positioning jig or the like was used to determine a position for formation of a connecting member 38. Then, to the determined position for formation on the electrode 12, there was adhered, by using the print paste as an adhesive, the connecting member 38 made of platinum (Pt) in a cylindrical form of a size of 2 mm diameter by 1 m length.

Next, to alumina powder of a purity of 99.9% by weight and an average particle size of 0.5 μm, water, a dispersing agent, and polyvinyl alcohol (PVA) as a binder were added, and mixed therewith by a trommel for preparation of a slurry. This slurry was atomized and dried by a spray dryer, to prepare granulated granules of alumina. Then, in a molding die, there was set the dielectric layer 13 of yttria sintered body formed with the electrode 12 and the connecting member 38, and granulated granules of alumina were filled over the dielectric layer 13 of yttria sintered body, electrode 12, and connecting member 38, and pressed by exerting thereon a pressure of 200 kgf/cm$^2$, to form a compact that constitutes a base body 31.

Next, the dielectric layer 13 of yttria sintered body, electrode 12, connecting member 38, and the compact of alumina were set in a carbon sheath, and sintered by a hot pressing method in a nitrogen atmosphere at a sintering temperature of 1600° C., to make the base body 31 of alumina sintered body.

A single sintered body thus obtained was processed for establishment of a centerline average surface roughness (Ra) of a substrate mounting side 16 to be 0.2 μm, a thickness of the dielectric layer 13 (i.e. the distance between the electrode 12 and the substrate mounting side 16) to be 0.3 mm, and a thickness of the electrostatic chuck 30 (i.e. the distance between the substrate mounting side 16 and a bottom side 17) to be 3 mm. Then, the base body 31 was drilled to form a hole 35 for application of a terminal 34, and the terminal 34 was brazed to the connecting member 38. By doing as described, there was obtained the electrostatic chuck 30 adapted to make use of Johnsen-Rahbek force.

The dielectric layer 13 of yttria sintered body was kept free from occurrences of cracks or chipping due to the machining. Also the brazing between the connecting member 38 and the terminal 34 could be done without damages to the base body 31 or dielectric layer 13 due to thermal stresses.

Evaluation of Chucking Force and Dechucking Response

For electrostatic chucks 10 and 30 of the embodiment examples 5 and 6, their chucking forces and dechucking responses were evaluated, as follows. With a silicon probe contacting on the substrate mounting side 16 of either electrostatic chuck 10 or 30 in a vacuum, a voltage was imposed between the electrode 12 and the probe, so that this probe was fixed to the electrostatic chuck 10 or 30 by chucking forces. The probe was then pulled up in a direction in which it is to be removed from the substrate mounting side 16 of electrostatic chuck 10 or 30, by a force required therefor, which was measured as a chucking force. Further, after cancellation of the voltage imposition, the silicon probe was allowed to dechuck from the electrostatic chuck 10 or 30 with a lapse of time, which was measured as a dechucking response time. The silicon probe had a contacting point area of 3 cm$^2$, and the imposed voltage was 2000 V/mm, while the measurement was made at room temperature.

For the electrostatic chucks 10 and 30 of embodiment examples 5 and 6, their chucking forces were both 50 Torr or more, thus exhibiting a high chucking performance, and their dechucking response times were both 1 sec. or less, thus exhibiting a favorable dechucking response.

While preferred embodiments of the present invention have been described using specific terms, such description is for illustrative purposes, and it is to be understood that changes and variations may be made without departing from the spirit or scope of the claims.

What is claimed is:

1. An electrostatic chuck adapted to make use of a Johnsen-Rahbek force, comprising:
  a base body;
  an electrode formed on the base body; and
  a dielectric layer formed on the electrode, and made by an yttria sintered body containing an amount of silicon carbide within a range of 10 to 30% by volume, and having a volume resistivity at room temperature within a range of $1\times10^8$ to $1\times10^{13}$ Ω·cm.

2. The electrostatic chuck as claimed in claim 1, wherein the base body is made by a sintered body containing alumina.

3. The electrostatic chuck as claimed in claim 1, wherein the base body is made by a yttria sintered body the same as the dielectric layer.

4. The electrostatic chuck as claimed in claim 1, further comprising:
  a terminal configured to connect the electrode to a power supply member; and
  a connecting member buried in the base body, joined to the electrode and the terminal, and configured to interconnect the electrode and the terminal.

5. The electrostatic chuck as claimed in claim 4, wherein the connecting member has a joint face with the electrode and a joint face with the terminal at a distance of 1 mm or more from each other.

6. The electrostatic chuck as claimed in claim 4, wherein the connecting member contains at least one of platinum and niobium.

7. A manufacturing method for forming an electrostatic chuck of a yttria sintered body adapted to make use of a Johnsen-Rahbek force comprising the steps of:
preparing raw material powder containing an amount of silicon carbide within a range of 5 to 40% by volume, and yttria;
forming a base body using the raw material powder;
forming an electrode on the base body;
forming a dielectric layer on the electrode and the base body; and
sintering in an inert gas atmosphere within a temperature range of 1500 to 2000° C. the base body, the electrode and the dielectric layer to form the electrostatic chuck,
wherein the dielectric layer comprises yttria and silicon carbide within a range of 10% to 30% by volume and has a volume resistivity at room temperature within a range of $1\times10^8$ to $1\times10^{13}$ Ω·cm.

8. The manufacturing method as claimed in claim 7, wherein the sintering comprises sintering the base body the electrode and the dielectric layer by a hot pressing method.

* * * * *